United States Patent
Daniel

(10) Patent No.: US 7,551,505 B1
(45) Date of Patent: Jun. 23, 2009

(54) MEMORY REFRESH METHOD AND APPARATUS

(75) Inventor: Alan Daniel, Durham, NC (US)

(73) Assignee: Qimonda North America Corp., Cary, NC (US)

( * ) Notice: Subject to any disclaimer, the term of this patent is extended or adjusted under 35 U.S.C. 154(b) by 39 days.

(21) Appl. No.: 11/950,778

(22) Filed: Dec. 5, 2007

(51) Int. Cl.
*G11C 7/00* (2006.01)
*G06F 13/00* (2006.01)

(52) U.S. Cl. .................. 365/222; 365/227; 711/106
(58) Field of Classification Search ................... 365/222
See application file for complete search history.

(56) References Cited

U.S. PATENT DOCUMENTS

| | | | | |
|---|---|---|---|---|
| 4,292,676 A | * | 9/1981 | Henig | 365/222 |
| 4,628,488 A | * | 12/1986 | Saku et al. | 365/189.18 |
| 5,717,644 A | | 2/1998 | Hadderman et al. | |
| 6,094,705 A | * | 7/2000 | Song | 711/106 |
| 6,167,484 A | * | 12/2000 | Boyer et al. | 711/106 |
| 6,178,479 B1 | * | 1/2001 | Vishin | 711/106 |
| 6,490,216 B1 | * | 12/2002 | Chen et al. | 365/222 |
| 6,603,694 B1 | | 8/2003 | Frankowsky et al. | |
| 6,781,908 B1 | | 8/2004 | Pelley et al. | |
| 6,819,618 B2 | * | 11/2004 | Kashiwazaki | 365/222 |
| 6,958,944 B1 | * | 10/2005 | Chou | 365/222 |
| 2003/0147295 A1 | | 8/2003 | Frankowsky et al. | |
| 2005/0248755 A1 | | 11/2005 | Chou et al. | |
| 2006/0010350 A1 | | 1/2006 | Pelley et al. | |
| 2006/0245288 A1 | | 11/2006 | Hokenmaier | |

* cited by examiner

*Primary Examiner*—Son L Mai
(74) *Attorney, Agent, or Firm*—Coats & Bennett, P.L.L.C.

(57) ABSTRACT

An integrated circuit includes one or more memory array segments configured to store information and a refresh controller. Each memory array segment has a plurality of memory cells arranged in rows selectable through a row address. The refresh controller is configured to monitor row address activity to identify which bits of the row address change state at least once during a memory access operation and to skip refresh of the rows associated with the row address bits that do not change state at least once during the memory access operation.

25 Claims, 10 Drawing Sheets

MEMORY REFRESH METHOD AND APPARATUS

BACKGROUND OF THE INVENTION

Memory devices have one or more arrays of memory cells for storing information. A bit of information is written to or read from a particular memory cell by selecting the row and column at the intersection of which is located the desired memory cell. Information is stored in the selected memory cell by either charging or discharging a capacitor associated with the cell. In some memory devices, charge stored on a memory cell capacitor leaks out over time. If memory cell leakage is not addressed, information stored in a memory device will be lost. To prevent data loss, information stored in memory devices is periodically refreshed. Examples of memory devices that may suffer from leakage include Dynamic Random Access Memory (DRAM) devices.

Data stored in a DRAM device is conventionally refreshed one row at a time. A row of memory cells is refreshed by selecting the row, reading the contents of the memory cells forming the row, and writing the same data back to the row. The predominant DRAM refresh operations are distributed and burst. During distributed refresh, memory access operations are evenly interspersed between refresh cycles. This way, data may be read from or written to a DRAM device between row refresh operations. During burst refresh, all refresh cycles are executed one right after the other until all rows have been refreshed. Thus, a DRAM device may not be accessed during a burst refresh. All addressable rows are typically refreshed during periodic distributed or burst refresh operations regardless of whether all rows are used when the DRAM device is active. However, some conventional approaches actively track which rows are accessed during normal DRAM operation, refreshing only the rows accessed during use. The circuit overhead needed to actively track which rows are accessed during normal operation becomes increasingly complex as the size of DRAM devices increase, thus consuming more chip area and power.

SUMMARY OF THE INVENTION

According to the methods and apparatus taught herein, one embodiment of an integrated circuit includes one or more memory array segments configured to store information and a refresh controller. Each memory array segment has a plurality of memory cells arranged in rows selectable through a row address. The refresh controller is configured to monitor row address activity to identify which bits of the row address change state at least once during a memory access operation and to skip refresh of the rows associated with the row address bits that do not change state at least once during the memory access operation.

Of course, the present invention is not limited to the above features and advantages. Those skilled in the art will recognize additional features and advantages upon reading the following detailed description, and upon viewing the accompanying drawings.

DETAILED DESCRIPTION OF THE INVENTION

Figure 1:
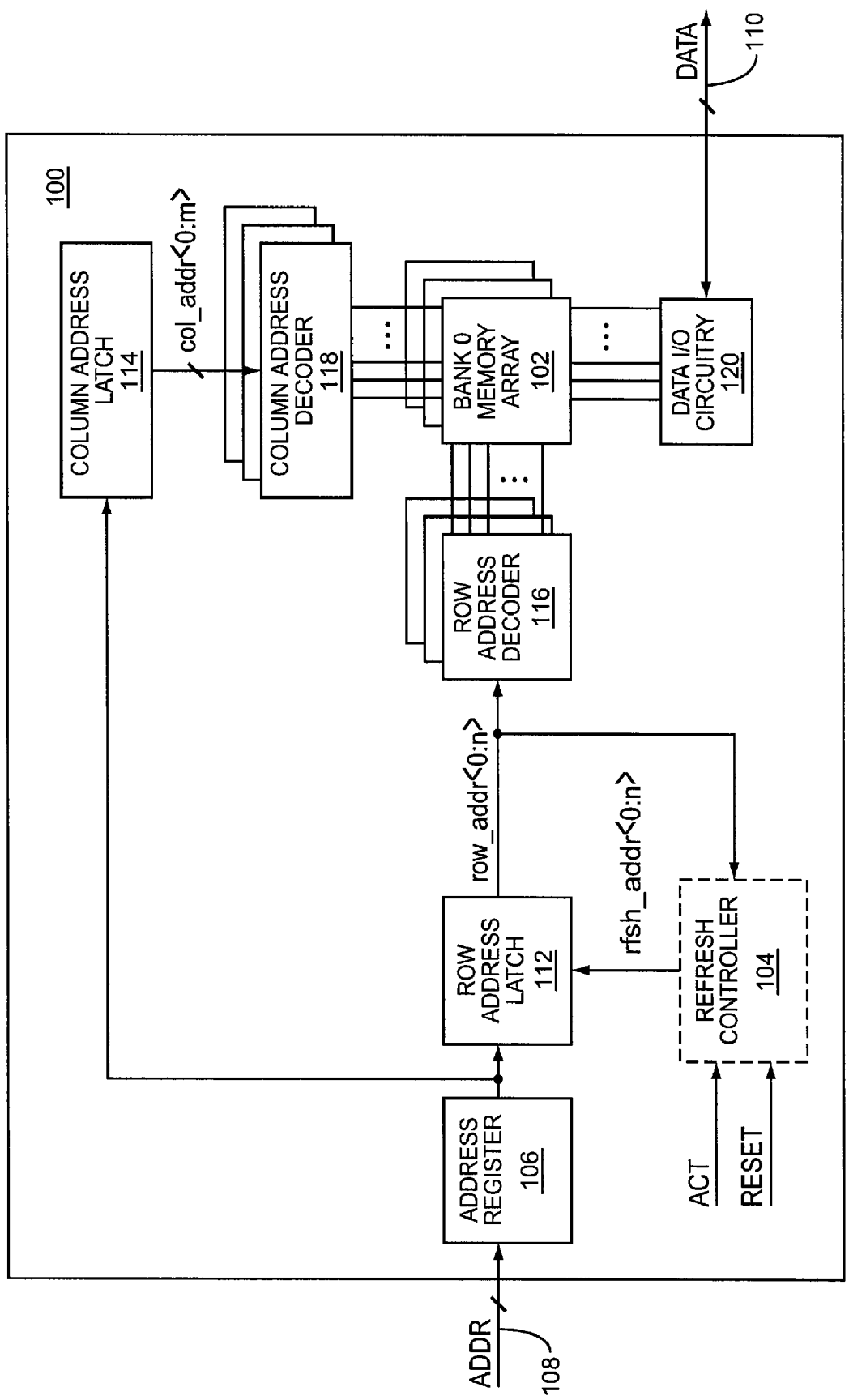
FIG. 1 is a block diagram of an embodiment of a memory device including a refresh controller.

FIG. 1 illustrates an embodiment of a Dynamic Random Access Memory (DRAM) device 100 such as Synchronous DRAM (SDRAM), Double Data Rate (DDR) SDRAM, Quad Data Rate (QDR) SDRAM, Synchronous Graphics DRAM, Pseudostatic SDRAM, embedded DRAM or the like. It is to be understood that the embodiments described herein may be applied to any type of memory that would benefit from a refresh operation. The DRAM device 100 includes a memory array 102 having rows of memory cells. The memory array 102 is arranged as one or more separately addressable segments such as a bank or any other type of logical and/or physical structure. A memory cell is accessed by providing the appropriate row address (row_addr<0:n>) and column address (col_addr<0:m>) to the memory device 100. Data is read from or written to selected memory cells. Rows of memory cells are periodically refreshed so that information stored in the DRAM device 100 is not corrupted. To this end, a refresh controller 104 monitors row address activity to determine which row address bits change state at least once during normal DRAM operation, e.g., during read and write operations. Rows associated with the address bits that do not change state at least once during normal DRAM operation are skipped during refresh operations. Thus, unutilized rows are not refreshed. Accordingly, the refresh controller 104 may shorten periodic refresh operations to improve DRAM performance as will be described in more detail later. Alternatively, the refresh controller 104 may reduce DRAM power consumption by adjusting the refresh clock frequency so that it coincides with the number of un-accessed rows as will also be described in more detail later.

During operation, address information (ADDR) is provided to the DRAM device 100 and stored in an address register 106. The address information indicates a row and column location in the memory array 102 to be accessed (and segment if the memory array 102 is so arranged). In some embodiments, row and column address information is carried over the same bus 108 while a separate bus 110 carries data. Accordingly, a row address is provided to the DRAM device 100, followed by a column address. Information written to the DRAM device 100 or read from the device 100 is carried by the data bus 110. In other embodiments, a reduced-pin bus interface (not shown) may be used for carrying address, data, and control information on the same bus. Regardless, row address information (row_addr<0:n>) is latched by a row address latch 112 while a column address latch 114 stores column address information (col_addr<0:m>). Row and column address decoders 116, 118 determine which memory cells in the memory array 102 are selected during a memory operation based on latched row and column addresses, respectively. Data is then written to or read from the selected memory cells via data Input/Output circuitry 120.

The refresh controller 104 provides a refresh row address (rfsh_addr<0:n>) to the row address latch 112 during a refresh operation. The refresh row address identifies particular rows in the array 102 to be refreshed. The refresh controller 104 activates the refresh row address bits to select different ones of the rows, the contents of which are then refreshed. However, not all rows are refreshed during the refresh operation. Instead, the refresh controller 104 monitors row address activity during normal DRAM operation to determine which row address bits change state at least once. The refresh controller 104 does not activate the row address bits that did not change state during normal DRAM operation, and thus the corresponding unutilized rows in the memory array 102 are not refreshed. As such, only those rows associated with address bits that change state at least once during normal DRAM operation are refreshed by the refresh controller 104.

Figure 2:
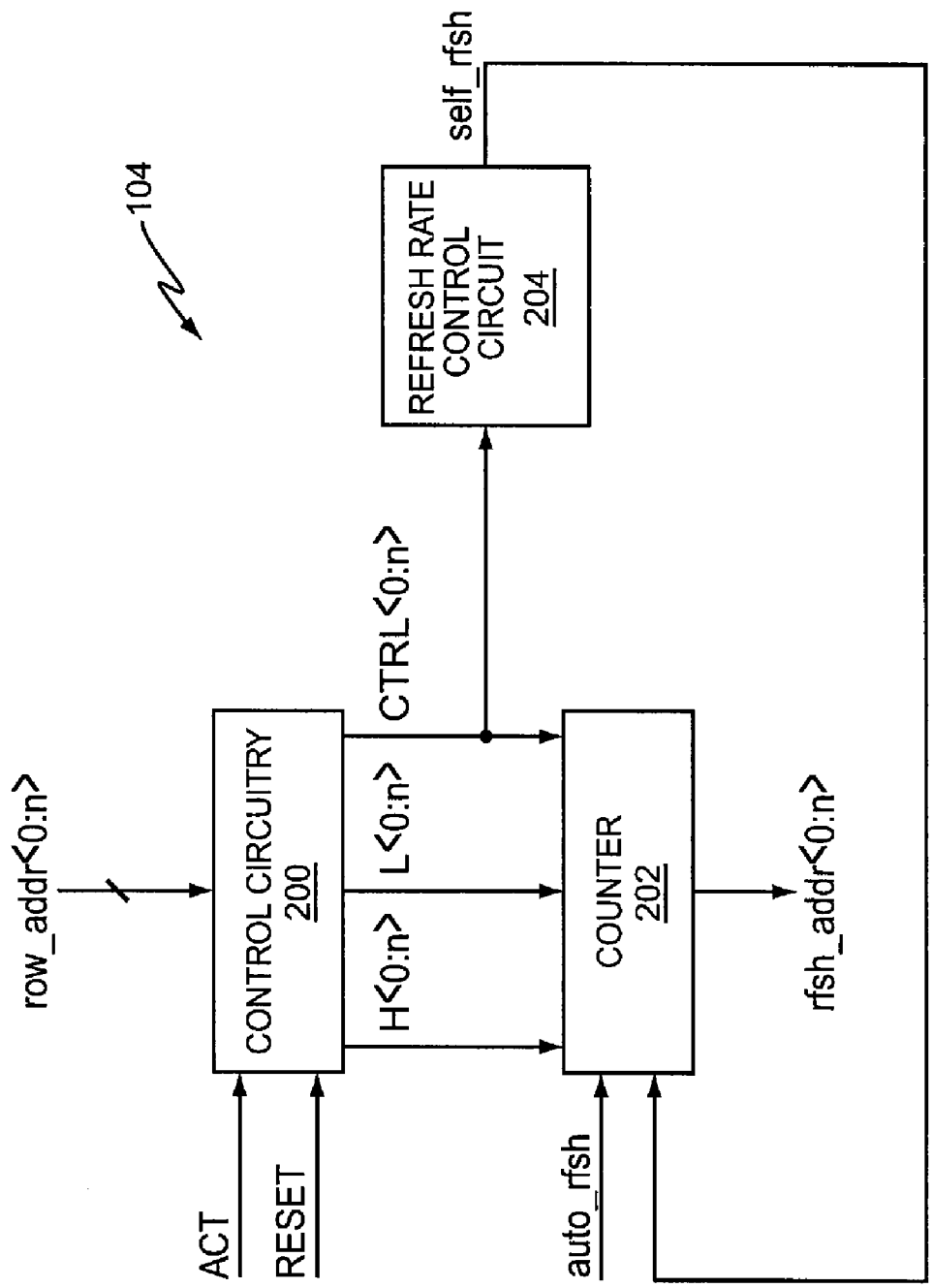
FIG. 2 is a block diagram of an embodiment of the refresh controller of FIG. 1.
Figure 3:
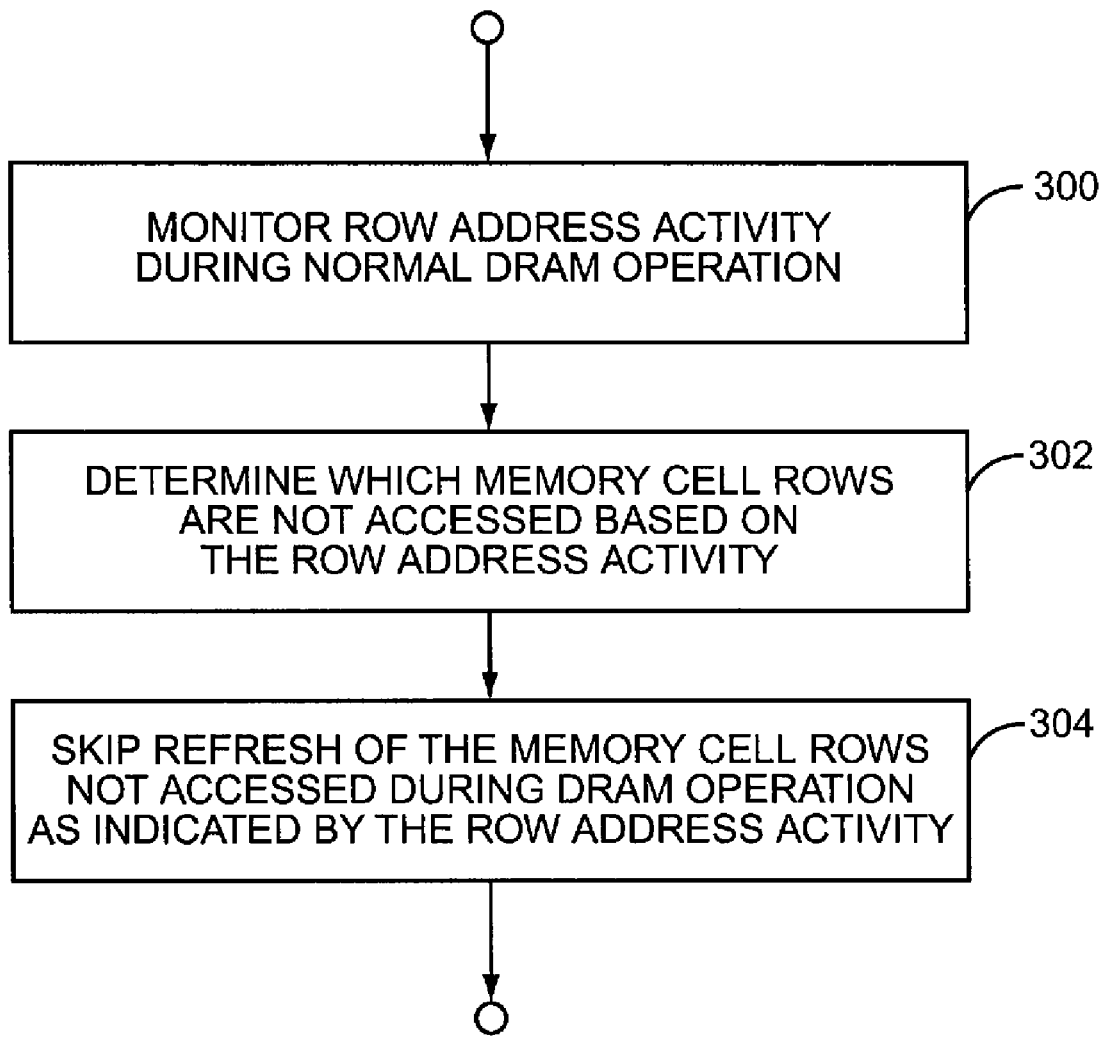
FIG. 3 is a logic flow diagram of one embodiment of program logic for selectively refreshing rows in the memory device of FIG. 1.

FIG. 2 illustrates an embodiment of the refresh controller 104. According to this embodiment, the refresh controller 104 comprises control circuitry 200, a counter 202 and a refresh rate control circuit 204. The control circuitry 200 monitors row address activity during normal DRAM operation, e.g., as illustrated by Step 300 of FIG. 3. This way, the row address bits that change state at least once during DRAM operation are identified. Based on the monitored row address activity, the control circuitry 200 determines which memory cell rows have not been accessed, e.g., as illustrated by Step 302 of FIG. 3.

The control circuitry 200 generates a control signal CTRL<0:n> having the same number of bits n as the row address. Each bit of the control signal corresponds to a respective bit of the row address. The control circuitry 200 programs each bit of the control signal CTRL<0:n> based on whether the corresponding row address bit changed state at least once when latched by the row address latch 112 during normal DRAM operation. A bit changes state when it switches from a logic one to logic zero state or vice-versa. As such, the control signal CTRL<0:n> indicates which row address bits have changed state at least once during normal DRAM operation. During a refresh operation, the counter 202 activates row addresses based on the state of the control signal CTRL<0:n>, skipping those rows associated with the row address bits that did not change state during normal DRAM operation as indicated by the control signal CTRL<0:n>. Thus, those rows not accessed during normal DRAM operation as indicated by the monitored row address activity are skipped during refresh operations, e.g., as illustrated by Step 304 of FIG. 3. The remaining rows are refreshed.

In more detail, each row of memory cells in the array 102 is selectable by setting the row address to a particular value. In a purely illustrative example illustrated in Table 1 below, sixteen rows (Row 0-Row 15) are uniquely addressable based on a 4-bit row address (row_addr<3:0>). A particular row is selected by setting the row address to a value which identifies the desired row. For example, row 0 is accessed by setting the row address to <0,0,0,0>, row 1 is accessed by setting the least significant bit of the row address to <0,0,0,1> and soon. In the present example, the default row address is set to <0,0,0,0> when the DRAM device is reset. The third row is then accessed followed by the fifth and seventh rows during normal DRAM operation. Accordingly, the row address successively changes state from <0,0,0,0> to <0,0,1,0> followed by <0,1,0,0> and finally <0,1,1,0>. The control circuitry 200 monitors the row address activity and sets the state of the control signal CTRL<0:n> accordingly where n=3 in the present example.

TABLE 1

Exemplary 4-Bit Row Address

| row_addr <3> | row_addr <2> | row_addr <1> | row_addr <0> | Row ID | Row States |
|---|---|---|---|---|---|
| 0 | 0 | 0 | 0 | Row 0 | Initial State |
| 0 | 0 | 0 | 1 | Row 1 | — |
| 0 | 0 | 1 | 0 | Row 2 | First State |
| 0 | 0 | 1 | 1 | Row 3 | — |
| 0 | 1 | 0 | 0 | Row 4 | Second State |
| 0 | 1 | 0 | 1 | Row 5 | — |
| 0 | 1 | 1 | 0 | Row 6 | Third State |
| 0 | 1 | 1 | 1 | Row 7 | — |
| 1 | 0 | 0 | 0 | Row 8 | — |
| 1 | 0 | 0 | 1 | Row 9 | — |
| 1 | 0 | 1 | 0 | Row 10 | — |
| 1 | 0 | 1 | 1 | Row 11 | — |
| 1 | 1 | 0 | 0 | Row 12 | — |
| 1 | 1 | 0 | 1 | Row 13 | — |
| 1 | 1 | 1 | 0 | Row 14 | — |
| 1 | 1 | 1 | 1 | Row 15 | — |

Initially, each bit of the control signal CTRL<0:n> is set to the same initial state, e.g., a logic one state. While the DRAM device 100 is active, only the control signal bits associated with row address bits that change state at least once during normal operation are triggered, e.g., from a logic one to a logic zero. Thus, each bit of the control signal CTRL<0:n> that remains in its initial state indicates that the corresponding row address bit did not change state at least once during normal DRAM operation. To the contrary, each triggered control bit indicates that the corresponding row address bit changed state. Based on the example illustrated in Table 1 above, the first and second bits of the control signal CTRL<0:n> switch from an initial value of one to a value of zero because only the first and second row address bits change state during normal DRAM operation. Accordingly, the control signal is set to CTRL<1,0,0,1> for indicating to the counter 202 that the second and third address bits row_addr<0> and row_addr<3> are not to be toggled during refresh, thus skipping refresh of Row 1, Row 3, Row 5, and Rows 7-15 in Table 1.

During a refresh cycle, the counter 202 does not activate the row address bits that did not change state during normal DRAM operation as indicated by the control signal CTRL<0:n>. This way, unutilized rows are not refreshed. Once a control signal bit is triggered, it remains in a triggered state until the DRAM device 100 is deactivated or the control circuitry 200 reset. Thus, the control circuitry 200 cumulatively monitors row address activity. When the DRAM device 100 is deactivated, a reset signal (RESET) causes the control circuitry 200 to reset the control signal CTRL<0:n> to an initial state. This way, the control circuitry 200 monitors row address activity anew upon reactivation of the DRAM device 100.

Figure 4:
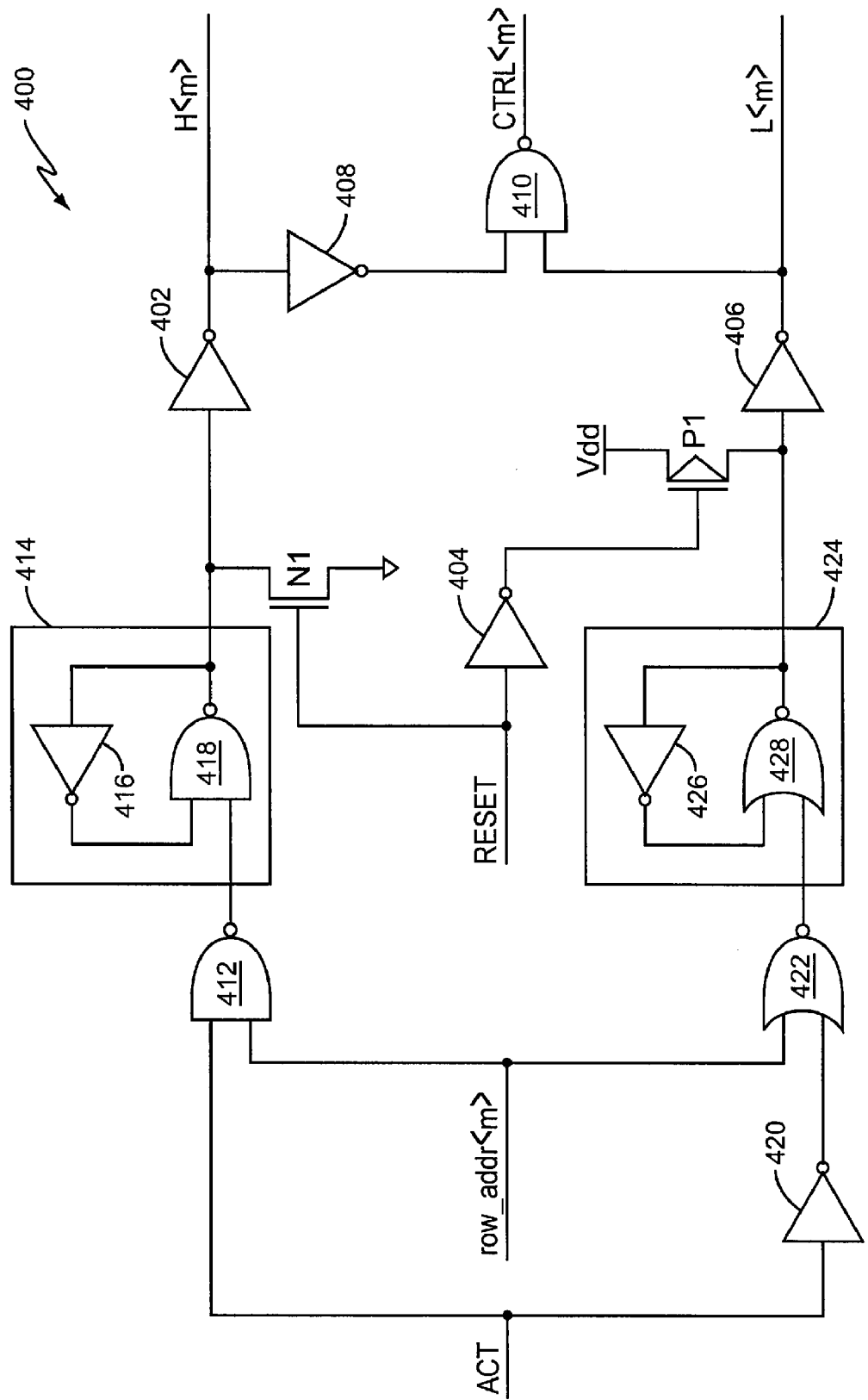
FIG. 4 is a block diagram of an embodiment of control circuitry included in the refresh controller of FIG. 1.

In one embodiment, the control circuitry 200 is segmented into several stages (not shown), each stage configured to generate one bit of the control signal CTRL<0:n>. FIG. 4 illustrates an embodiment of one stage 400 of the control circuitry 200. The control stage 400 monitors row address activity for the $m^{th}$ bit of the row address (row_addr<0:n>). Initially, the $m^{th}$ control signal bit (CTRL<m>) is set to a predetermined state such as a logic one. If the $m^{th}$ row address bit changes state at least once when the DRAM device is active, the $m^{th}$ control signal bit is set to a triggered state such as a logic zero to indicate the $m^{th}$ address bit has been set in both logic states. Otherwise, the $m^{th}$ control signal bit remains in its initial state to indicate the $m^{th}$ row address bit has not changed state during normal DRAM operation. Once the $m^{th}$ control signal bit is triggered, it remains in a triggered state until the stage 400 is reset. The $m^{th}$ stage 400 also generates other control signals (H<m> and L<m>) used by the counter 202 to maintain the $m^{th}$ row address bit in its initial activation state during refresh if the bit does not change state during normal DRAM operation as will be described in detail later.

In more detail, an activate signal (ACT) enables the $m^{th}$ stage 400 when the DRAM device 100 is active. In one embodiment, the activate signal is a clock pulse periodically delivered when a new row address is ready for latching. A reset signal (RESET) resets the control signals generated by stage 400 to their respective initial states. In the present embodiment, the reset signal drives an n-fet transistor N1 to ground. A first inverter 402 inverts the n-fet transistor output, thus resetting control signal H<m> to a logic one state. A second inverter 404 drives a p-fet transistor P1 to Vdd responsive to the active reset signal. A third inverter 406 inverts the p-fet transistor output, thus resetting control signal L<m> to a logic zero state. Finally, a fourth inverter 408 and a NAND gate 410 reset the $m^{th}$ bit of the control signal CTRL<m> to a logic one state. Of course, the control signals CTRL<m>, H<m> and L<m> may be reset to other states. Regardless, the $m^{th}$ stage 400 monitors the $m^{th}$ row address bit after the stage 400 has been reset and the DRAM device 100 activated.

When the activate signal ACT is first activated and the $m^{th}$ row address bit is at a logic high level, control signal H<m> transitions from its initial logic one state to a logic zero state while control signal L<m> remains in its initial logic zero state. Control signal CTRL<m> likewise remains in its initial logic one state. Particularly, a second NAND gate 412 outputs a logic low signal to a first trigger circuit 414 when the $m^{th}$ row address bit is initially at a high level. The first trigger circuit 414, comprising an inverter 416 and a NAND gate 418, outputs a logic one signal which is inverted by the first inverter 402, thus causing the low transition in control signal H<m>. A fifth inverter 420 inverts the activate signal (ACT) and provides the inverted signal to a NOR gate 422. The NOR gate 422 outputs a logic zero signal to a second trigger circuit 424 because the $m^{th}$ row address bit is initially at a logic high level when the activate signal ACT is first activated. The second trigger circuit 424, comprising an inverter 426 and a NOR gate 428, outputs a logic one signal because the p-fet transistor P1 initially drives the inverter 426 of the second trigger circuit 424 with a logic one value. Thus, the control signal L<m> remains in its initial logic zero state. Because control signal L<m> remains in its initial logic zero state, control signal CTRL<m> also remains in its initial logic one state.

Conversely, if the $m^{th}$ row address bit is at a logic low level when the activate signal ACT is first activated, control signal H<m> remains in its initial logic one state while control signal L<m> transitions from its initial logic zero state to a logic one state. Control signal CTRL<m> likewise remains in its initial logic one state. Particularly, the second NAND gate 412 outputs a logic high signal to the first trigger circuit 414 when the $m^{th}$ row address bit is initially at a low level. The first trigger circuit 414 outputs a logic zero signal which is inverted by the first inverter 402, thus causing the control signal H<m> to remain in its initial state. The NOR gate 422 outputs a logic one signal to the second trigger circuit 424 because both its inputs are low. The second trigger circuit 424 outputs a logic zero signal which is inverted by the p-fet transistor, thus causing the control signal L<m> to transition to a logic one state.

Initially, the first and second trigger circuits 414, 424 are set in an address evaluation state. That is, the output of the trigger circuits 414, 424 depend upon the value of the $m^{th}$ row address bit. However, once the $m^{th}$ row address bit changes state at least once, the trigger circuit inverters 416, 426 prevent the trigger circuit outputs from changing state regardless of address bit activity. Thus, once the $m^{th}$ row address bit changes state at least once, the first trigger circuit 414 always outputs a logic one while the second trigger circuit 424 always outputs a logic zero. As such, the NAND gate 410 that produces control signal CTRL<m> always outputs a logic zero after the $m^{th}$ row address bit changes state at least once. This way, the control circuitry 200 identifies to the counter 202 which row address bits changes state at least once during normal DRAM operation by triggering the appropriate bits of the control signal CTRL<0:n>.

Figure 5:
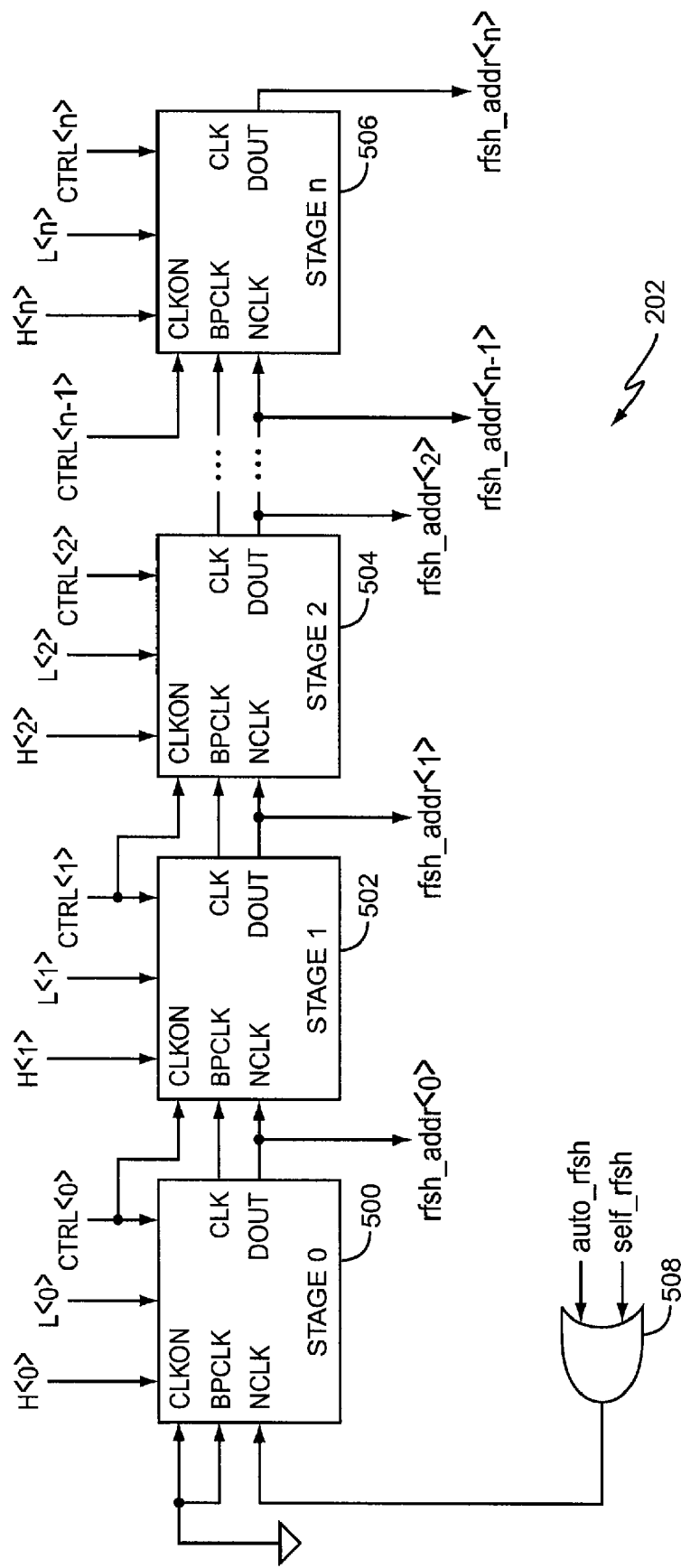
FIG. 5 is a block diagram of an embodiment of a counter included in the refresh controller of FIG. 1.

FIG. 5 illustrates an embodiment of the counter 202. According to this embodiment, the counter 202 is segmented into n stages 500-506. Each stage 500-506 outputs one bit of the n-bit refresh address rfsh_addr<0:n>. The refresh address determines which rows in the memory array 102 are activated during a refresh operation and depends upon the state of the control signal CTRL<0:n> generated by the control circuitry 200. Each counter stage 500-506 functions in either a normal mode or a bypass mode. Stages 500-506 configured in normal mode activate their respective address bit outputs to ensure rows accessed during normal DRAM operation are periodically refreshed. Stages 500-506 configured in bypass mode maintain their respective address bit outputs at a constant logic level to ensure that the corresponding rows not accessed during normal DRAM operation are not refreshed.

The control signal CTRL<0:n> indicates which counter stages 500-506 should be configured in bypass mode and which ones should not. If one or more bits of the control signal CTRL<0:n> have not been triggered by the control circuitry 200, the corresponding refresh address bits are bypassed during refresh. That is, the counter 202 determines which bits of the refresh address rfsh_addr<0:n> are bypassed during refresh based on which bits of the control signal CTRL<0:n> have been triggered and which ones have not. Bypassed refresh address bits are not activated during refresh. Instead, they are held in a constant logic state thus effectively skipping the rows that would have been selected if the bypassed bits were activated. The remaining refresh address bits are activated by the counter 202 in a manner such that each row accessed during normal DRAM operation are periodically refreshed.

In more detail, each counter stage 500-506 receives one bit of the control signals CTRL<0:n>, H<0:n>, and L<0:n> generated by the control circuitry 200 and outputs a refresh address bit based on the state of the received control signal bits. For example, the first stage 500 (STAGE 0) receives CTRL<0>, H<0>, and L<0> and outputs rfsh_addr<0>. The second stage 502 (STAGE 1) receives CTRL<1>, H<1>, and L<1> and outputs rfsh_addr<1>. The third stage 504 (STAGE 2) receives CTRL<2>, H<2>, and L<2> and outputs rfsh_addr<2>. Finally, the $n^{th}$ stage 506 (STAGE n) receives CTRL<n>, H<n>, and L<n> and outputs rfsh_addr<n>.

If the $m^{th}$ control signal bit CTRL<m> has been triggered, the $m^{th}$ counter stage activates the $m^{th}$ refresh address bit with a frequency based on either a clock or data signal output by the previous counter stage (m−1) as will be described in more detail later. Otherwise, the $m^{th}$ counter stage is in bypass mode and maintains the $m^{th}$ refresh address bit at a constant logic state. The state at which the bypassed address bit is maintained depends on the state of the H<m> and L<m> control signal bits received by the $m^{th}$ stage. For example, if the $m^{th}$ address bit does not change state from its initial activation state during normal DRAM operation, the H<m> and L<m> control signal bits indicate that the m$^{th}$ refresh address bit should be maintained in a logic one state.

The rate at which a counter stage 500-506 configured in normal mode activates its address bit output depends upon the mode of the previous stage. If the m-1 stage is not in bypass mode, the m$^{th}$ stage selects the activated address bit output (DOUT) of stage m-1 as its clock signal input (NCLK). Accordingly, the m$^{th}$ counter stage uses CTRL<m-1> as a clock select input (CLKON). If CTRL<m-1> has been triggered, the m$^{th}$ stage uses the activated address bit output of the m-1 stage as its clock signal. This way, activation of the m-1 refresh address bit actuates the m$^{th}$ counter stage.

However, the m$^{th}$ stage selects a bypass clock input (BPCLK) as its clock signal if the m-1 stage is in bypass mode, i.e., CTRL<m-1> has not been triggered. The bypass clock input corresponds to the clock signal output by the previous stage (CLK). This way, if stage m-1 is in bypass mode, the m$^{th}$ stage is not clocked by the constant address bit output by stage m-1. Instead, the m$^{th}$ stage is actuated by the clock signal output by the m-1 stage. The clock signal output by each counter stage 500-506 is either the bypass clock (BPCLK) output by the previous stage if the previous stage is in bypass mode or the activated address bit output by the previous stage if the previous stage is in normal mode. This way, proper timing is maintained within the counter.

Each counter stage 500-506 maintains timing control as previously described except for the first stage 500. The first stage 500 is clocked by either an auto refresh clock signal (auto_rfsh) generated by the DRAM device 100 or a self refresh clock signal (self_rfsh) generated by the refresh rate control circuit 204. Particularly, the first stage clock enable input (CLKON) and bypass clock input (BPCLK) are at a fixed state such as ground to ensure the first stage 500 selects an active clock signal. This way, the counter 202 functions properly when the first stage 500 is in bypass mode. That is, the first stage 500 passes the active clock signal input to its clock output (CLK). The second stage 502 selects the clock output of the first stage 500 when CTRL<0> indicates the first stage 500 is in bypass mode. Otherwise, the second stage 502 selects the activated address bit output of the first stage 500 as its clock signal. A logic OR gate 508 allows either the auto or self refresh clock signal to pass to the first logic stage 500.

Figure 6:
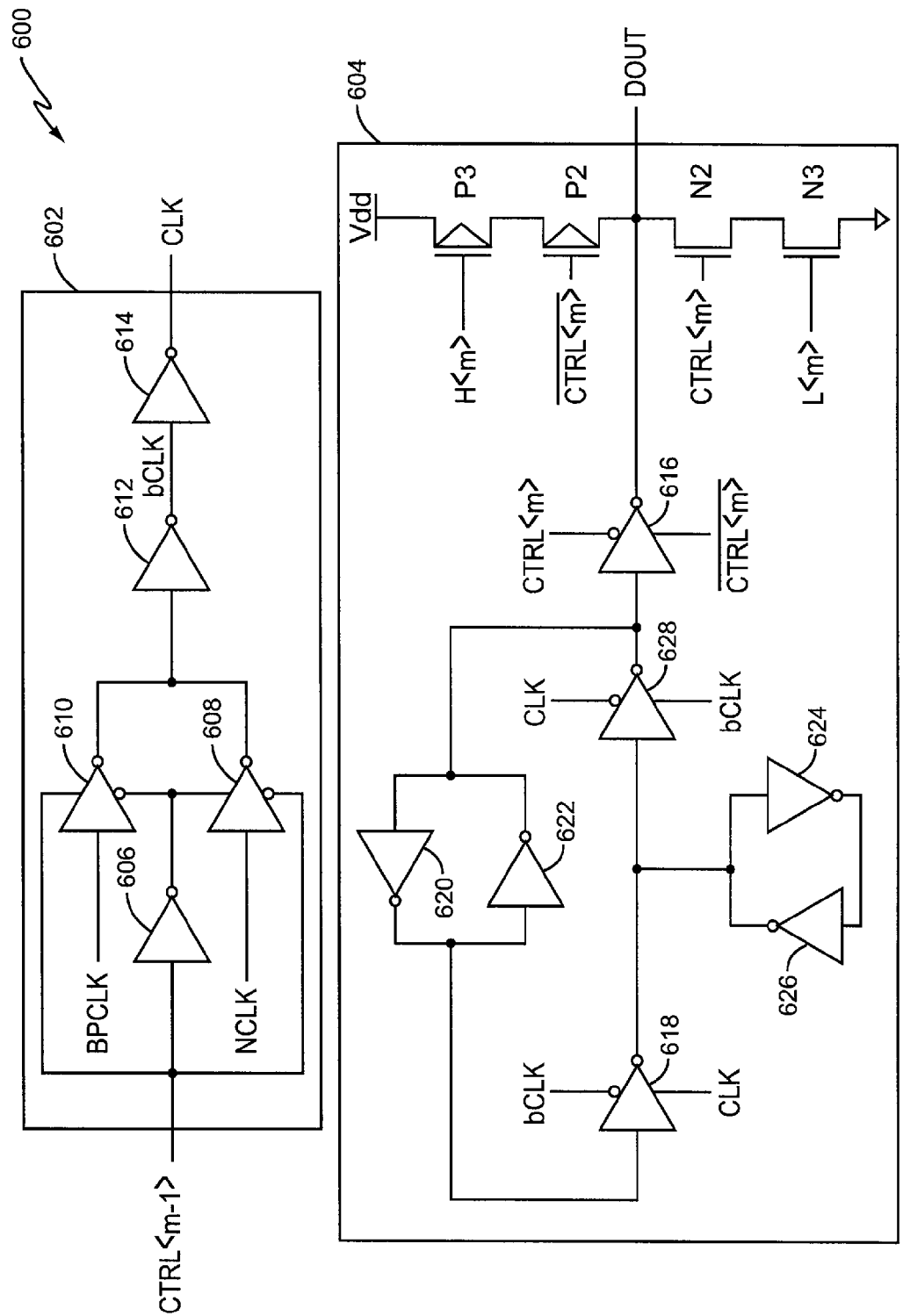
FIG. 6 is a block diagram of an embodiment of one stage of the counter of FIG. 5.

FIG. 6 illustrates an embodiment of an m$^{th}$ stage 600 of the counter 202. The m$^{th}$ stage 600 includes a clock generation circuit 602 and an address bit generation circuit 604. The clock generation circuit 602 yields a clock signal for controlling operation of the address bit generation circuit 604. The clock generation circuit 602 selects either the clock signal output (CLK) by stage m-1 or the activated address bit output (DOUT) by stage m-1 based on the clock enable input (CLKON) of the m$^{th}$ stage 600. The clock enable input ensures proper operation of the m$^{th}$ stage 600.

The clock enable input corresponds to the control signal bit CTRL<m-1> used by stage m-1 to determine the state of its refresh address bit. Thus, for the m$^{th}$ stage 600, CLKON=CTRL<m-1>. If CTRL<m-1> has been triggered (e.g., is in a logic zero state), a first inverter 606 of the clock generation circuit 602 activates a second inverter 608 of the clock generation circuit 602. The activated second inverter 608 causes the activated address bit output by stage m-1 to be used as the clock signal (NCLCK) for the m$^{th}$ stage 600. The m$^{th}$ stage 600 processes the CTRL<m>, H<m>, and L<m> control signal bits responsive to transitions in the address bit output by the m-1 counter stage when stage m-1 is not in bypass mode.

If CTRL<m-1> has not been triggered (e.g., is in a logic one state), stage m-1 is in bypass mode. Accordingly, the address bit output by stage m-1 is not used to clock the m$^{th}$ stage 600 because it does not periodically transition between high and low logic states. Instead, the clock generation circuit 602 selects the clock output by stage m-1. Particularly, the first inverter 606 of the clock generation circuit 602 activates a third inverter 610 of the clock generation circuit 602. The activated third inverter 610 causes the bypass clock signal input (BPCLK) of the m$^{th}$ stage 600 to be selected. This way, the m$^{th}$ stage 600 uses the clock signal output by stage m-1 instead of the refresh address bit output by stage m-1. As such, the clock enable input signal (CLKON) ensures that the clock generation circuit 602 provides a properly-oscillating clock signal to the address bit generation circuit 604. Particularly, fourth and fifth inverters 612, 614 of the clock generation circuit 602 generate a clock signal (CLK) and an inverted clock signal (bCLK) for use by the address bit generation circuit 604.

The address bit generation circuit 604 places the m$^{th}$ stage 600 in bypass mode when CTRL<m> has not been triggered. Particularly, a first gated inverter 616 included in the address bit generation circuit 604 prevents activation of the address bit output (DOUT) by the m$^{th}$ stage 600 when CTRL<m> has not been triggered (e.g., in a logic one state). Instead, DOUT is driven to the same state in which the m$^{th}$ address bit was initially activated and never changed from during normal DRAM operation. The control signals H<m> and L<m> determine the constant logic state of DOUT in bypass mode. H<m> and L<m> are both set to a logic zero when the m$^{th}$ address bit is activated at a logic one and to a logic one when the m$^{th}$ address bit is activated at a logic zero as previously described. This way, DOUT is driven to a constant logic one state by first and second p-fet transistors P2 and P3 when H<m>=0 and to a constant logic zero state by first and second n-fet transistors N2 and N3 when H<m>=1.

The address bit generation circuit 604 places the m$^{th}$ stage 600 in normal mode when CTRL<m> has been triggered. The address bit generation circuit 604 activates the address bit output (DOUT) of the m$^{th}$ stage 600 responsive to the CLK and bCLK signals when in normal mode. Particularly, the first gated inverter 616 of the address bit generation circuit 604 enables activation of DOUT when CTRL<m> has been triggered (e.g., in a logic zero state). To this end, a second gated inverter 618 included in the address bit generation circuit 604 inverts the current state of DOUT as maintained by a first pair of inverters 620, 622 included in the address bit generation circuit 604. This causes a second pair of inverters 624, 626 included in the address bit generation circuit 604 to change the bit state of DOUT. However, the new bit state maintained by the second pair of inverters 624, 626 does not affect DOUT until a third gated inverter 628 included in the address bit generation circuit 604 is enabled. This occurs on falling edge transitions of the clock signal CLK. Thus, when the m$^{th}$ stage 600 is not in bypass mode, DOUT transitions at a frequency ½ that at which the previous active stage transitions its address bit output. This way, the counter 202 increments the refresh address in a binary fashion as is well known in the art, but skipping the address bits that do not change state at least once during normal DRAM operation as indicated by the control signal CTRL<0:n>.

Figure 7:
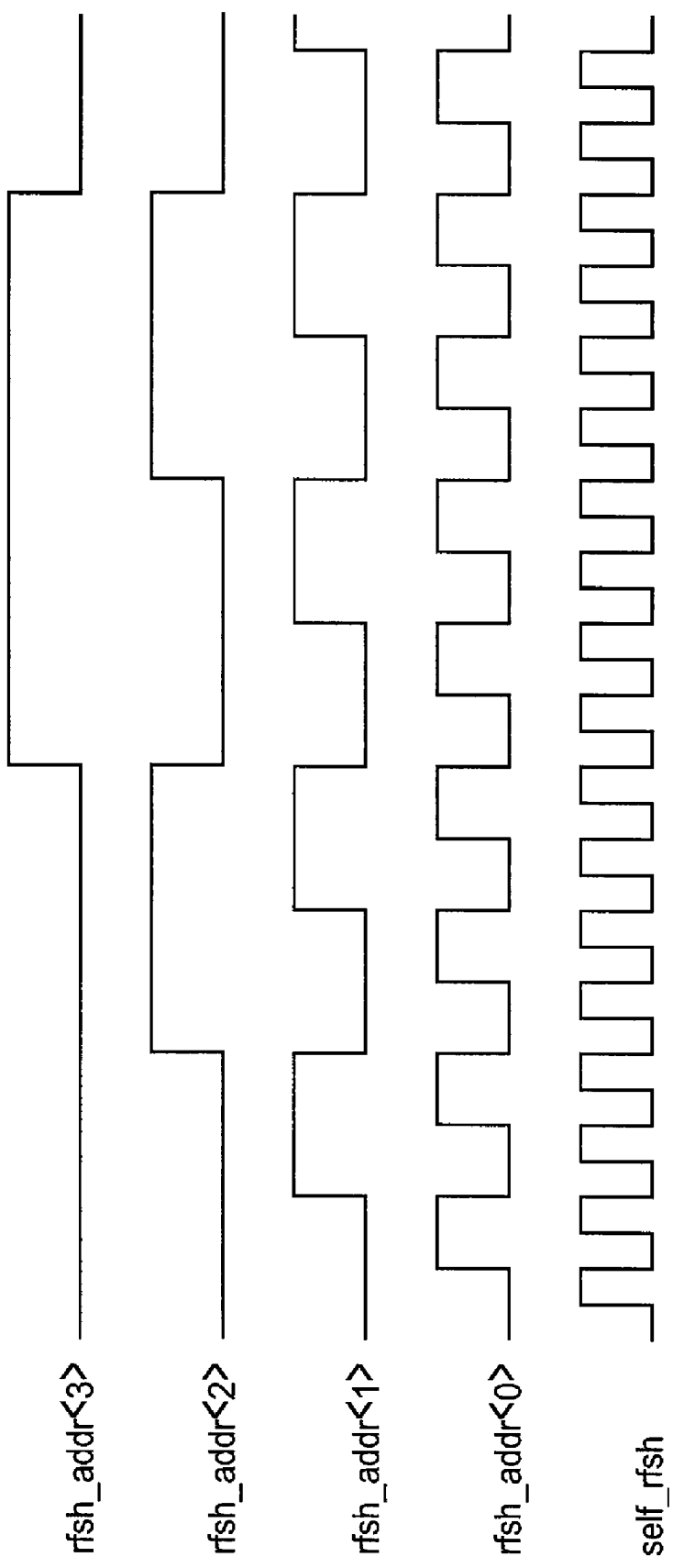
FIG. 7 is a plot illustrating refresh addresses generated by the counter of FIG. 5.

By way of example, if the memory array 102 had sixteen rows of memory cells uniquely addressable through a 4-bit row address row_addr<0:3> as shown in Table 1 above, the counter 202 would comprise four stages 600. Each counter stage 600 is associated with one of the four row address bits. The counter outputs a 4-bit refresh address rfsh_addr<0:3> based on a four-bit control signal CTRL<0:3> generated by the control circuitry 200 as previously described. If all row address bits change state at least once during normal DRAM operation then all bits of CTRL<0:3> are triggered. Accordingly, the counter 202 activates all bits of the refresh address during a refresh operation where each successive bit has a period twice that of the immediately preceding bit, e.g., as illustrated in FIG. 7. Particularly, the first refresh address bit rfsh_addr<0> has a period twice that of the self refresh clock signal (self_rfsh) generated by the refresh rate control circuit 204. The second counter stage uses the activated address bit output of the first stage as its clock signal. Accordingly, the address bit output of the second stage rfsh_addr<1> has a period twice that of the address bit output by the first stage and so on.

Figure 8:
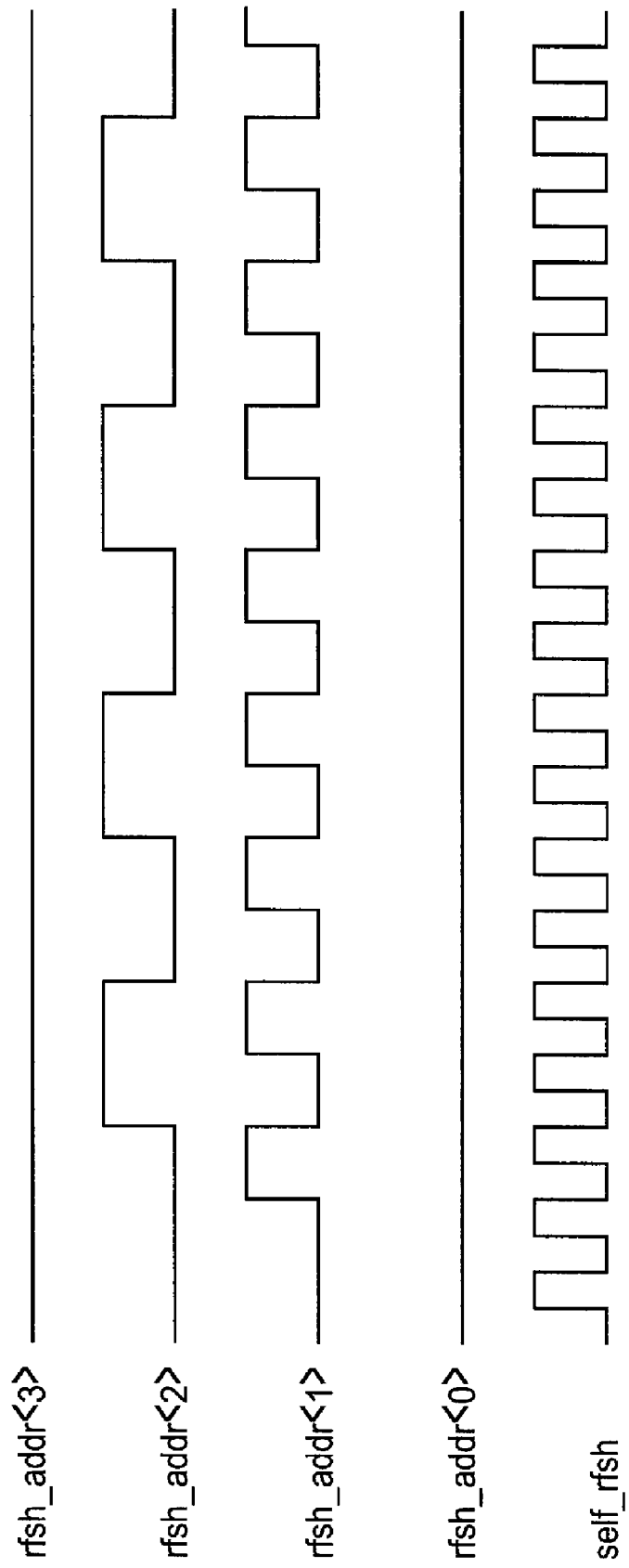
FIG. 8 is a plot illustrating different refresh addresses generated by the counter of FIG. 5.

However, if some of the rows are not accessed during normal DRAM operation, then some bits of CTRL<0:3> are not triggered. Accordingly, the counter 202 activates only those row address bits whose corresponding control signal bit CTRL<0:3> has been triggered. Take, for example, Table 1 above where only the second and third row address bits row_addr<1> and row_addr<2> changed state at least once during normal DRAM operation. Accordingly, the counter 202 activates only the second and third refresh address bits rfsh_addr<1> and rfsh_addr<2> during a refresh operation as shown in FIG. 8. Particularly, the first and last refresh address bits rfsh_addr<0> and rfsh_addr<3> remain at a fixed logic low state during the refresh operation. To the contrary, the second and third refresh address bits rfsh_addr<1> and rfsh_addr<2> transition during the refresh operation because their corresponding row address bits changed state during normal DRAM operation.

In the present example, a second stage of the counter 202 uses the self refresh clock signal (self_rfsh) as output by a first stage of the counter 202 for timing because the first stage of the counter 202 is in bypass mode. As such, the address bit output by the second stage of the counter 202 transitions at a frequency ½ that of the self refresh clock signal. The activated address bit output by the second stage of the counter 202 serves as the clock for the third stage of the counter 202 because the second counter stage is not in bypass mode. Thus, the third refresh address bit transitions at a frequency ½ that of the second refresh address bit or ¼ of the self refresh clock signal.

The refresh rate control circuit 204 may shorten the refresh cycle based on the number of rows not to be refreshed as identified by the control circuitry 200, thus improving DRAM performance. For example, the memory array 102 may have $2^{13}$ rows (8192 rows). Accordingly, the row address is thirteen bits wide. The refresh period may be 64 ms for refreshing all 8192 rows or 7.8 μs per row. However, the refresh rate control circuit 204 may shorten the refresh period if not all rows are to be refreshed. In one embodiment, the refresh rate control circuit 204 determines the refresh period based on the number of rows not to be refreshed as indicated by the control signal CTRL<0:n> as given by:

$$RFSH_{T(NEW)} = \frac{RFSH_{T(x=n)}}{2^{(n-x)}} \quad (1)$$

where n is the total number of rows, $RFSH_{T(x=n)}$ is the refresh period when all rows are to be refreshed (e.g., 64 ms), $RFSH_{T(NEW)}$ is the newly calculated refresh period and x is the number of triggered bits in the control signal CTRL<0:n>. This way, the refresh period may be adjusted based on the number of row address bits that do not change state at least once during normal DRAM operation, thus improving DRAM performance.

Alternatively, the refresh rate control circuit 204 reduces DRAM power consumption when the refresh period is held constant by adjusting the frequency of the self refresh clock signal to coincide with the number of row address bits that have not changed state at least once during normal DRAM operation. DRAM power consumption is reduced when the refresh clock frequency corresponds to the number of row address bits that have not changed state because the refresh clock pulses no faster than needed for refreshing the identified rows within a fixed refresh period (e.g., 64 ms). That is, the frequency of the refresh clock signal may be lowered to coincide with the number of row address bits to be skipped during refresh. The relationship between refresh clock frequency and the number of row address bits to be skipped during refresh is given by:

$$RFSH_{Freq(NEW)} = \frac{RFSH_{Freq(x=0)}}{2^{(n-x)}} \quad (2)$$

where $RFSH_{Freq(NEW)}$ is the newly determined clock frequency, $RFSH_{Freq}(x=0)$ is the clock frequency when all rows are to be refreshed, n is the total number of rows and x is the number of triggered bits in the control signal CTRL<0:n>. For example, if all rows are to be refreshed, $RFSH_{Freq(NEW)} = RFSH_{Freq(x=0)}$. However, if one or more rows are not to be refreshed, the refresh clock frequency may be reduced accordingly. Thus, the refresh rate control circuit 204 adjusts the refresh period or the refresh clock frequency based on the number of row address bits not to be refreshed during a refresh cycle.

Figure 9:
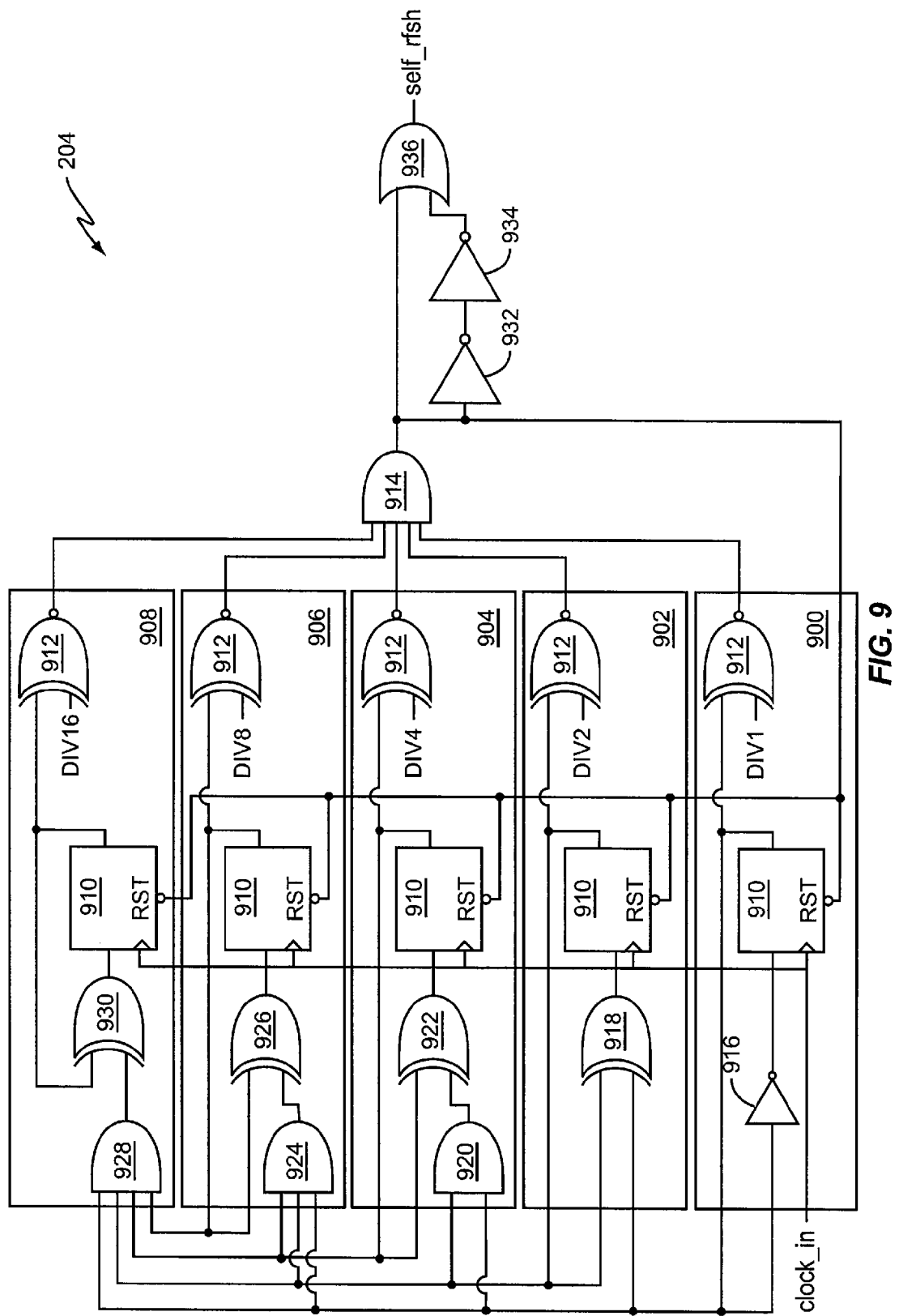
FIG. 9 is a block diagram of an embodiment of a refresh rate control circuit included in the refresh controller of FIG. 1.

FIG. 9 illustrates an embodiment of the refresh rate control circuit 204. According to this embodiment, the circuit 204 generates a self refresh clock signal (self_rfsh) having a frequency coinciding with the number of row address bits not to be refreshed. The self refresh clock signal may have any duty cycle, e.g., the signal may be pulsed. Regardless, the refresh rate control circuit 204 adjusts the frequency of a clock signal input (clock_in) based on the number of control signal bits CTRL<0:n> triggered by the control circuitry 200 in accordance with equation (2). Particularly, the refresh rate control circuit 204 generates a frequency divider signal (DIV) that effectively divides the frequency of the input clock signal based on the state of the control signal CTRL<0:n>.

The number of frequency divider states is based on the length of the row address and thus the length of the control signal CTRL<0:n>. For example, in the case of the 4-bit row address shown in Table 1 above, the frequency divider signal has five states as shown in FIG. 9 and Table 2 below. Based on equation (2), the possible frequency divider states associated with the 4-bit row address are: divide-by-1 (DIV1); divide-by-2 (DIV2); divide-by-4 (DIV4); divide-by-8 (DIV8); and divide-by-16 (DIV16). The current state of the frequency divider signal is based on the number of row address bits that changed state at least once during normal DRAM operation, i.e., the number of triggered bits contained in the control signal CTRL<0:n>. That is, the current frequency divider state corresponds to $2^{(n-x)}$ where n is the total number of row address bits and x is the number of triggered bits in the control signal CTRL<0:n>.

Continuing with the 4-bit row address example, the divide-by-1 state occurs when all four row address bits change state at least once during normal DRAM operation, i.e., each of the control signal bits CTRL<0:3> have been triggered (e.g., set to a logic zero value). Accordingly all rows are refreshed, and thus, the self refresh clock signal has the same frequency as the clock signal input to the refresh rate control circuit. The divide-by-2 state occurs when all but one of the four row address bits change state at least once during normal DRAM operation. The divide-by-4 state occurs when two row address bits change state at least once and the divide-by-8 state occurs when only one bit changes state. Finally, the divide-by-16 state occurs when none of the four address bits change state. In general, when none of n row address bits change state during normal DRAM operation, the refresh rate control circuit 204 divides the input clock frequency by 2' and only the row corresponding to the initial row address is refreshed.

TABLE 2

Control Signal CTRL<0:n> Mapping

| CTRL <3> | CTRL <2> | CTRL <1> | CTRL <0> | DIV1 | DIV2 | DIV4 | DIV8 | DIV16 |
|---|---|---|---|---|---|---|---|---|
| 0 | 0 | 0 | 0 | 1 | 0 | 0 | 0 | 0 |
| 0 | 0 | 0 | 1 | 0 | 1 | 0 | 0 | 0 |
| 0 | 0 | 1 | 0 | 0 | 1 | 0 | 0 | 0 |
| 0 | 0 | 1 | 1 | 0 | 0 | 1 | 0 | 0 |
| 0 | 1 | 0 | 0 | 0 | 1 | 0 | 0 | 0 |
| 0 | 1 | 0 | 1 | 0 | 0 | 1 | 0 | 0 |
| 0 | 1 | 1 | 0 | 0 | 0 | 1 | 0 | 0 |
| 0 | 1 | 1 | 1 | 0 | 0 | 0 | 1 | 0 |
| 1 | 0 | 0 | 0 | 0 | 1 | 0 | 0 | 0 |
| 1 | 0 | 0 | 1 | 0 | 0 | 1 | 0 | 0 |
| 1 | 0 | 1 | 0 | 0 | 0 | 1 | 0 | 0 |
| 1 | 0 | 1 | 1 | 0 | 0 | 0 | 1 | 0 |
| 1 | 1 | 0 | 0 | 0 | 0 | 1 | 0 | 0 |
| 1 | 1 | 0 | 1 | 0 | 0 | 0 | 1 | 0 |
| 1 | 1 | 1 | 0 | 0 | 0 | 0 | 1 | 0 |
| 1 | 1 | 1 | 1 | 0 | 0 | 0 | 0 | 1 |

For ease of explanation only, operation of the refresh rate control circuit 204 is described next with reference to a 4-bit row address. Accordingly, the refresh rate control circuit 204 has five stages 900-908. Each stage 900-908 includes a latch 910 and XNOR logic gate 912. The latches 910 are controlled by the clock signal input (clock_in) provided to the refresh rate control circuit 204. Each latch 910 may be reset (RST) depending on the state of the rate control circuit 204. Initially, the latches 910 are reset to a logic zero value.

Figure 10:
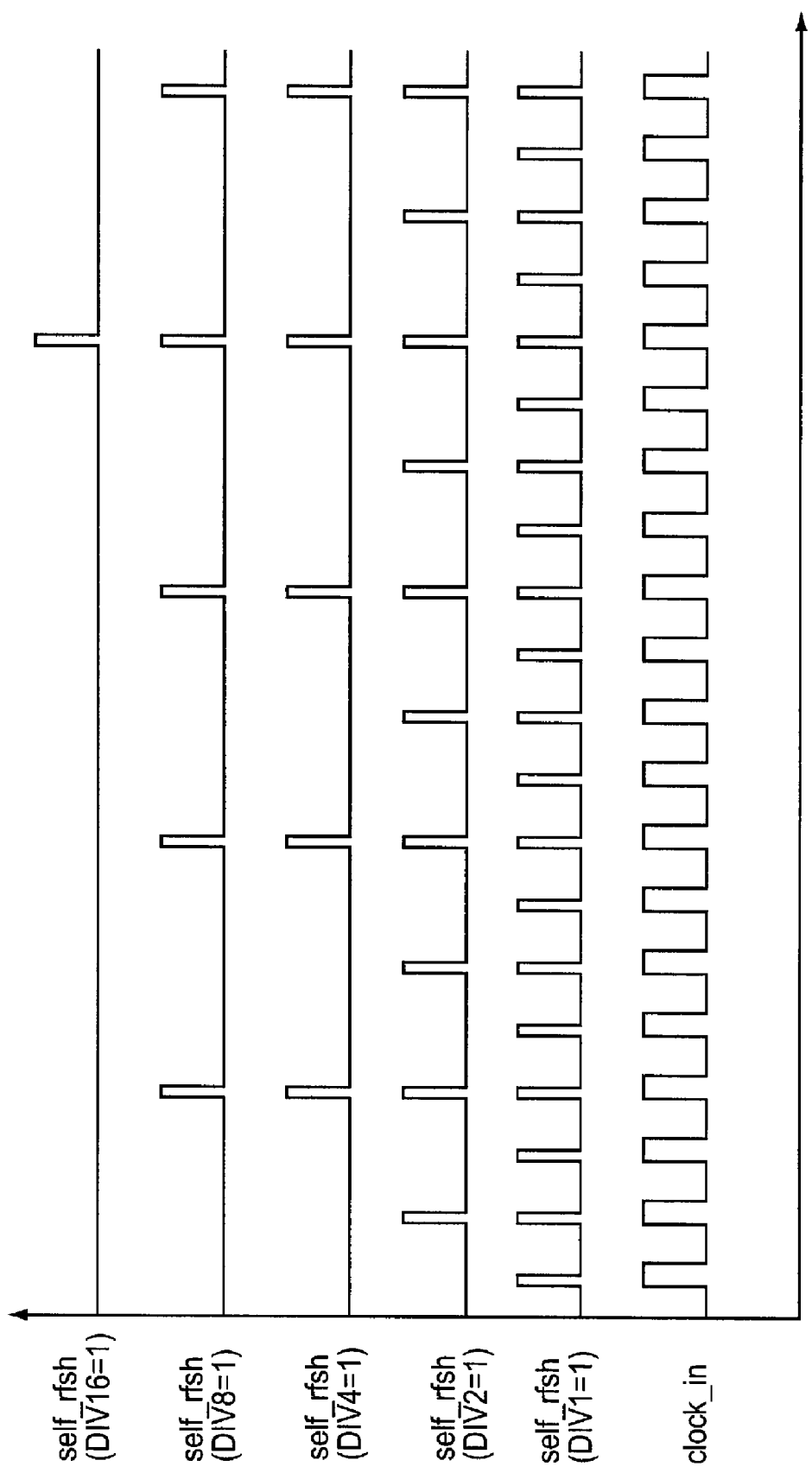
FIG. 10 is a plot illustrating different refresh clocks generated by the refresh rate control circuit of FIG. 9.

The first stage 900 causes the refresh rate control circuit 204 to output a clock pulse at the same frequency as the input clock signal when the frequency divider state is divide-by-1 (i.e., all rows are to be refreshed). Particularly, the output of a five-input logic AND gate 914 follows the output of the first logic stage 900. An inverter 916 included in the first logic stage 900 causes the output of the first stage latch 910 to alternate states responsive to a rising edge transition in the clock input signal. During a first clock cycle following reset, the output of the first stage 900 transitions to a logic one responsive to a rising-edge transition in the input clock signal. Before the clock input signal drops low, the first stage inverter 916 causes the output of the first stage latch 910 to transition back to a logic zero state. When the input clock signal completes the falling-edge transition during the first clock cycle, the first stage latch 910 holds the logic zero state. Thus, the clock signal output by the refresh rate control circuit 204 follows the input clock signal when the frequency divider state is divide-by-1 as shown in FIG. 10.

When the state of the frequency divider signal is divide-by-2 (i.e., all rows but one are to be refreshed), the first stage 900 causes the output of the second stage 902 to pulse at ½ the frequency of the input clock signal. Further, the output of the five-input logic AND gate 914 follows the output of the second logic stage 902. Thus, the frequency of the clock signal output by the refresh rate control circuit 204 is ½ that of the input clock signal when the frequency divider state is divide-by-2 (DIV2=1). Particularly, the first stage 900 inverts the clock input signal when the divide-by-1 state is inactive (DIV1=0). An XOR gate 918 included in the second stage 902 causes the second stage 902 to output a logic zero during the first input clock cycle, thus causing the refresh clock signal to remain in a logic zero state. During the next clock cycle, the latch outputs of the first and second stages 900, 902 cause the XOR gate 918 of the second stage 902 to change state which is captured by the second stage latch 910 during a falling edge transition in the input clock signal. As such, the second stage 902 outputs a pulse during the second input clock cycle. The third, fourth and fifth stages 904, 906, 908 do not adversely impinge upon the operation of the second stage 902 when the current state of the frequency divider signal is divide-by-2. Thus, the refresh clock signal pulses at ½ the frequency of the input clock signal when the current state of the frequency divider signal is divide-by-2 as shown in FIG. 10 because only ½ of the rows are to be refreshed.

When the state of the frequency divider signal is divide-by-4 (i.e., two rows are to be refreshed), the first and second stages 900, 902 cause the third stage 904 to output a pulse at ¼ the frequency of the input clock signal. Particularly, the first stage 900 causes the second stage 902 to output a pulse at ½ the frequency of the input clock signal when the divide-by-1 state is inactive (DIV1=0). In turn, the second stage 902 causes the third stage 904 to output a pulse at ½ the frequency of the second stage 902 when the divide-by-2 state is also inactive (DIV2=0). Accordingly, a two-input AND gate 920 and an XOR gate 922 included in the third stage 904 cause the third stage 904 to output a pulse every fourth cycle of the input clock based on the latch states of the first, second and third stages 900, 902, 904. The fourth and fifth stages 906, 908 do not adversely impinge upon the operation of the third stage 904 when the current state of the frequency divider signal is divide-by-4 (DIV4=1). Thus, the refresh rate control circuit 204 outputs a pulse at ¼ the frequency of the input clock signal when the state of the frequency divider signal is divide-by-4 as shown in FIG. 10 because only ¼ of the rows are to be refreshed.

The fourth stage 906 controls the refresh clock frequency when the current state of the frequency divider signal is divide-by-8 (DIV8=1). The fourth stage 906 includes a three-input AND gate 924 and an XOR gate 926. The fourth stage 906 outputs a pulse every eight input clock cycles based on the latch states of the first, second, third and fourth stages 900, 902, 904, 906. The fifth stage 908 does not adversely impinge upon the operation of the fourth stage 906 when the current state of the frequency divider signal is divide-by-8 (DIV8=1). Thus, the refresh rate control circuit 204 outputs a pulse once every eight cycles of the input clock signal when the state of the frequency divider signal is divide-by-8 as shown in FIG. 10 because only one of the four control signal bits CTRL<0:3> has been triggered.

The fifth stage 908 controls the refresh clock frequency when the current state of the frequency divider signal is divide-by-16 (DIV16=1). The fifth stage 908 includes a four-input AND gate 928 and a XOR gate 930. The fifth stage 908 outputs a pulse every sixteen input clock cycles based on the latch states of the first through fifth stages 900-908. The refresh clock signal has one-sixteenth the frequency of the input clock signal when the current state of the frequency divider signal is divide-by-16 as shown in FIG. 10 because none of the four control signal bits CTRL<0:3> have been triggered. Optional inverters 932, 934 and a logic OR gate 936 may be included at the output of the refresh rate circuit 204 for adjusting the pulse width of the refresh clock signal.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. In an integrated circuit having rows of memory cells selectable through a row address, a method of selectively refreshing the rows comprising:
    monitoring row address activity to identify which bits of the row address change state at least once during a memory access operation; and
    skipping refresh of the rows associated with the row address bits that do not change state at least once during the memory access operation.

2. The method of claim 1, further comprising determining a refresh clock frequency based on which row address bits do not change state at least once during the memory access operation.

3. The method of claim 1, further comprising determining a refresh period based on which row address bits do not change state at least once during the memory access operation.

4. The method of claim 1, wherein monitoring row address activity to identify which bits of the row address change state at least once during the memory access operation comprises triggering individual bits of a control signal based on which row address bits change state at least once when the integrated circuit is active.

5. The method of claim 4, wherein skipping refresh of the rows associated with the row address bits that do not change state at least once during the memory access operation comprises activating the row address bits associated with each triggered bit of the control signal during a refresh cycle while maintaining the remaining row address bits in a constant logic state.

6. The method of claim 4, further comprising determining a refresh clock frequency based on the number of triggered control signal bits.

7. The method of claim 4, further comprising determining a refresh period based on the number of triggered control signal bits.

8. An integrated circuit, comprising:
    one or more memory array segments configured to store information, each memory array segment having a plurality of memory cells arranged in rows selectable through a row address; and
    a refresh controller configured to monitor row address activity to identify which bits of the row address change state at least once during a memory access operation and to skip refresh of the rows associated with the row address bits that do not change state at least once during the memory access operation.

9. The integrated circuit of claim 8, wherein the refresh controller is further configured to determine a refresh clock frequency based on which row address bits do not change state at least once during the memory access operation.

10. The integrated circuit of claim 8, wherein the refresh controller is further configured to determine a refresh period based on which row address bits do not change state at least once during the memory access operation.

11. The integrated circuit of claim 8, wherein the refresh controller is configured to trigger individual bits of a control signal based on which row address bits change state at least once when the integrated circuit is active.

12. The integrated circuit of claim 11, wherein the refresh controller is configured to activate the row address bits associated with each triggered bit of the control signal during a refresh cycle while maintaining the remaining row address bits in a constant logic state.

13. The integrated circuit of claim 11, wherein the refresh controller is further configured to determine a refresh clock frequency based on the number of triggered control signal bits.

14. The integrated circuit of claim 11, wherein the refresh controller is further configured to determine a refresh period based on the number of triggered control signal bits.

15. In an integrated circuit having rows of memory cells selectable through a row address, a method of selectively refreshing the rows comprising:
    identifying one or more bits of the row address which do not change state at least once when the integrated circuit is active;
    skipping refresh of the rows selectable through the identified row address bits; and
    determining a refresh clock frequency based on how many row address bits are identified.

16. The method of claim 15, wherein identifying one or more bits of the row address which do not change state at least once when the integrated circuit is active comprises triggering individual bits of a control signal based on which row address bits change state at least once when the integrated circuit is active.

17. The method of claim 16, wherein skipping refresh of the rows selectable through the identified row address bits comprises activating the row address bits associated with each triggered bit of the control signal during a refresh cycle while maintaining the remaining row address bits in a constant logic state.

18. The method of claim 16, wherein determining the refresh clock frequency comprises determining the refresh clock frequency based on the number of triggered control signal bits.

19. An integrated circuit, comprising:
    one or more memory array segments configured to store information, each memory array segment having a plurality of memory cells arranged in rows selectable through a row address; and
    a refresh controller configured to identify one or more bits of the row address which do not change state at least once when the integrated circuit is active, to skip refresh of the rows selectable through the identified row address bits, and to determine a refresh clock frequency based on how many row address bits are identified.

20. The integrated circuit of claim 19, wherein the refresh controller is configured to trigger individual bits of a control signal based on which row address bits change state at least once when the integrated circuit is active.

21. The integrated circuit of claim 20, wherein the refresh controller is configured to activate the row address bits associated with each triggered bit of the control signal during a refresh cycle while maintaining the remaining row address bits in a constant logic state.

22. The integrated circuit of claim 20, wherein the refresh controller is configured to determine the refresh clock frequency based on the number of triggered control signal bits.

23. A system, comprising:

a controller;

one or more memory array segments coupled to the controller and configured to store information, each memory array segment having a plurality of memory cells arranged in rows selectable through a row address; and a refresh controller configured to monitor row address activity to identify which bits of the row address change state at least once during a memory access operation and to skip refresh of the rows associated with the row address bits that do not change state at least once during the memory access operation.

24. The system of claim 23, wherein the refresh controller is further configured to determine a refresh clock frequency based on which row address bits do not change state at least once during the memory access operation.

25. The system of claim 24, wherein the refresh controller is further configured to determine a refresh period based on which row address bits do not change state at least once during the memory access operation.

* * * * *